(12) United States Patent
Ohsaki et al.

(10) Patent No.: US 7,050,150 B2
(45) Date of Patent: May 23, 2006

(54) EXPOSURE APPARATUS

(75) Inventors: Yoshinori Ohsaki, Tochigi (JP); Yuichi Osakabe, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/794,032

(22) Filed: Mar. 4, 2004

(65) Prior Publication Data

US 2004/0179176 A1    Sep. 16, 2004

(30) Foreign Application Priority Data

Mar. 10, 2003   (JP)   ............................. 2003-064107

(51) Int. Cl.
*G03B 27/42* (2006.01)
*G03B 27/54* (2006.01)

(52) U.S. Cl. .......................................... 355/53; 355/67

(58) Field of Classification Search .................. 355/52, 355/53, 55, 67; 356/399–401; 250/548; 430/311

See application file for complete search history.

(56) References Cited

U.S. PATENT DOCUMENTS

| 5,309,197 | A  | * | 5/1994  | Mori et al.  | 355/53  |
| 6,151,102 | A  | * | 11/2000 | Nishi        | 355/53  |
| 6,160,619 | A  | * | 12/2000 | Magome       | 356/503 |
| 6,400,445 | B1 | * | 6/2002  | Nishi et al. | 355/72  |

* cited by examiner

*Primary Examiner*—Henry Hung Nguyen
(74) *Attorney, Agent, or Firm*—Morgan & Finnegan, LLP

(57) ABSTRACT

Provided is an exposure apparatus for exposing a pattern of a reticle mounted on a first stage onto a substrate which is mounted on a second stage through a projection optical system, in which focus calibration can be conducted with high precision and a throughput can be increased. The exposure apparatus includes at least three detection systems capable of simultaneously detecting three or more marks formed at different positions on at least one of the substrate and the second stage through the projection optical system.

8 Claims, 10 Drawing Sheets

EXPOSURE APPARATUS

BACKGROUND OF THE INVENTION

1. Field of the Invention

The present invention generally relates to an exposure apparatus, and more particularly to an exposure apparatus used to exposure a substrate to be processed, such as a single crystalline substrate for a-semiconductor wafer. The present invention is suitable to, for example, an exposure apparatus for exposing a single crystalline substrate for a semiconductor wafer by a step-and-scan method in a photolithographic process.

2. Related Background Art

Up to now, there has been used a projection exposure apparatus for projecting a circuit pattern drawn on a reticle or a mask (these terms are interchangeably used-in the present application) to a wafer or the like by a projection optical system to transfer the circuit pattern when a minute semiconductor device such as a semiconductor memory or a logic circuit is produced using a photolithographic (printing) technique.

Recently, as shown in FIGS. 9 and 10, in order to improve a resolution and to expand an exposure region, a scanning projection exposure apparatus 1000 that exposes the entire reticle pattern to each exposure region of a wafer WP through a projection optical system 1200 by illuminating a portion of a reticle RC and scanning the reticle RC and the wafer WP in synchronous with each other using a reticle stage 1100 and a wafer stage 1300 (which is also called a "scanner") attracts lots of attention. FIG. 9 is a schematic perspective view showing an exemplary structure of a conventional scanning projection exposure apparatus 1000. FIG. 10 is a schematic cross sectional view showing the exemplary structure of the conventional scanning projection exposure apparatus 1000. Note that an illumination apparatus that illuminates the reticle RC on which a circuit pattern is formed is omitted in FIGS. 9 and 10.

A reticle side reference plate (hereinafter referred to as an "R side reference plate") 1110 which a plurality of positional measurement marks are provided on a reflective surface is fixedly disposed in a predetermined area near the reticle RC on the reticle stage 1100. A wafer side reference plate (hereinafter referred to as a "W side reference plate") 1310 where a plurality of positional measurement marks are provided on a reflective surface is fixed disposed in a predetermined area near the wafer WP on the wafer stage 1300. In the scanning projection exposure apparatus 1000, a focus detection system 1400 is provided as a focal position detecting unit that detects the positional measurement marks and measures a displacement in position of the wafer WP in the optical axis direction of the projection optical system 1200.

However, when the projection optical system 1200 absorbs exposure heat or when a surrounding environment varies, an error is caused between a measurement origin of the focus detection system 1400 and the focal plane of the projection optical system 1200. Therefore, in order to measure the error for the correction (focus calibration), a through-the-reticle (TTR) alignment optical system 1500 is constructed.

The TTR alignment optical system 1500 has a function of a position detecting unit that detects relative positions between the R side reference plate 1110 and the W side reference plate 1310. The detected relative positions are used to calculate a base line of an off-axis alignment optical system 1600 and a deviation between the scanning direction of the reticle stage 1100 and the scanning direction of the wafer stage 1300 (XY calibration). Here, the base line indicates a distance between a shot center at the time of wafer alignment and a shot center at the time of exposure (optical axis of the projection optical system). In some cases, a value of the base line changes according to various environmental factors or the like. Therefore, it is necessary for the exposure apparatus to measure the base line and to correct it. Note that, as shown in FIG. 11, the TTR alignment optical system 1500 can be constructed so as to detect the relative positions between the R side reference plate 1110 and the W side reference plate 1310 from, the rear side of the W side reference plate 1310, that is, the image plane side of the projection optical system 1200. FIG. 11 is a schematic cross sectional view showing an exemplary structure of the conventional scanning projection exposure apparatus 1000.

In the exposure apparatus, a reduction in size of a pattern to be transferred, that is, an increase in resolution is increasingly required according to an increase in scale of integration of the semiconductor devices. It is impossible to satisfy such requirements only through the reduction in exposure light wavelength. Therefore, in recent years, in order to satisfy the requirement for the increase in resolution, in addition to the reduction in exposure light wavelength, a numerical aperture (NA) of the projection optical system is increased from a conventional NA of about 0.6 to a high NA which exceeds 0.8.

Thus, because the focal depth becomes extremely smaller than conventional ones, a significant improvement in detection precision of the focal position, in particular, an improvement in precision with respect to the focus calibration is required. In addition, alignment precision increases with increasing a resolution, so that a further improvement in precision is required for the XY calibration such as the measurement of the base line or the like.

On the other hand, an improvement in throughput (the number of wafers processed per unit time) is required for the exposure apparatus. Therefore, in addition to the improvements in measurement precision with respect to the focus calibration and the XY calibration, shortening a measurement time is greatly demanded.

In the conventional scanning projection exposure apparatus 1000, when the scanning direction is used as the Y-axis direction, a first detection system 1510 and a second detection system 1520 of the TTR alignment optical system 1500 are generally disposed on an axis parallel to the X-axis within an exposure slit so as to become symmetrical about the Y-axis. Measurement results at two image heights (measurement points) are used for the focus calibration and the XY calibration. In particular, in the case of detecting a focal surface position using the TTR alignment optical system 1500, as shown in FIG. 12, respective drive areas (detection areas) MEa and MEb of the first detection system 1510 and the second detection system 1520 are made symmetrical about the optical axis of the projection optical system 1200 on the X-axis. While the symmetry about the optical axis is maintained, a position of the first detection system 1510 and a position of the second detection system 1520 are changed. Then, the focal measurement is performed at a plurality of image heights (measurement points) KP to define an exposure image plane in a direction perpendicular to the scanning direction (X-axis direction). FIG. 12 is a schematic view showing drive (detection) areas of the conventional TTR alignment optical system 1500.

In the conventional TTR alignment optical system 1500, when the exposure image plane in the X-axis direction is determined, it is necessary to drive the first detection system 1510 and the second detection system 1520. Therefore, measurement takes a long time and a reduction in measurement precision resulting from a drive error is caused.

When the NA of the projection optical system becomes a high NA which exceeds 0.8, the focal depth greatly decreases. Therefore, it is required that, the tilt of the image plane in a direction parallel to the scanning direction (Y-axis direction) in which a problem is not caused up to now is measured, the image plane is corrected by driving, for example, a lens in the projection optical system according to the tilt to be aligned with the actual exposure surface, and exposure is performed. However, as shown in FIG. 12, the TTR alignment optical system 1500 performs the measurement at the plurality of image heights (measurement points) symmetrical about the Y-axis in the exposure slit ES. Thus, the tilt of the image plane in the direction parallel to the scanning direction cannot be measured.

Further, a two-dimensional CCD device is generally used for sensors 1512 and 1522 in the first detection system 1510 and the second detection system 1520 that compose the TTR alignment optical system 1500. Mark measurement is performed by picking up enlarged images of the positional alignment marks formed onto the two-dimensional CCD device. However, the photoelectric conversion efficiency of the two-dimensional CCD device decreases with shortening an exposure light wavelength. Therefore, it is required that intenser light is made incident into the two-dimensional CCD device. When the intenser light is made incident into the two-dimensional CCD device, it is necessary to emit the intenser light from a light source or to reduce a enlargement magnification of the TTR alignment optical system 1500, because the transmittances (efficiencies) of all optical systems such as the TTR alignment optical system 1500 and the projection optical system 1200 drop by shortening the exposure light wavelength.

However, it is technically very hard to emit the intense light from the light source. In addition, even if the intense light can be emitted, a problem regarding the durability of the optical systems is caused. On the other hand, when the enlargement magnification of the TTR alignment optical system 1500 is reduced (for example, when the enlargement magnification is changed to ½, the illuminance on an image pickup device quadruples), a reduction in measurement precision is caused.

SUMMARY OF THE INVENTION

Therefore, an exemplary object of the present invention is to provide an exposure apparatus in which high precision focus calibration is realized and a high resolution and an improvement in throughput can be achieved.

In order to achieve the above-mentioned object, according to an aspect of the present invention, an exposure apparatus in which a pattern of a reticle mounted on a first stage is irradiated with exposure light and exposed onto a substrate which is mounted on a second stage through a projection optical system, includes at least three detection systems capable of simultaneously detecting three or more marks formed at different positions on at least one of the substrate and the second stage through the projection optical system.

Further objects of the present invention and other features of the present invention will be apparent from a preferred embodiment described below with reference to the accompanying drawings.

DESCRIPTION OF THE PREFERRED EMBODIMENTS

Figure 1:
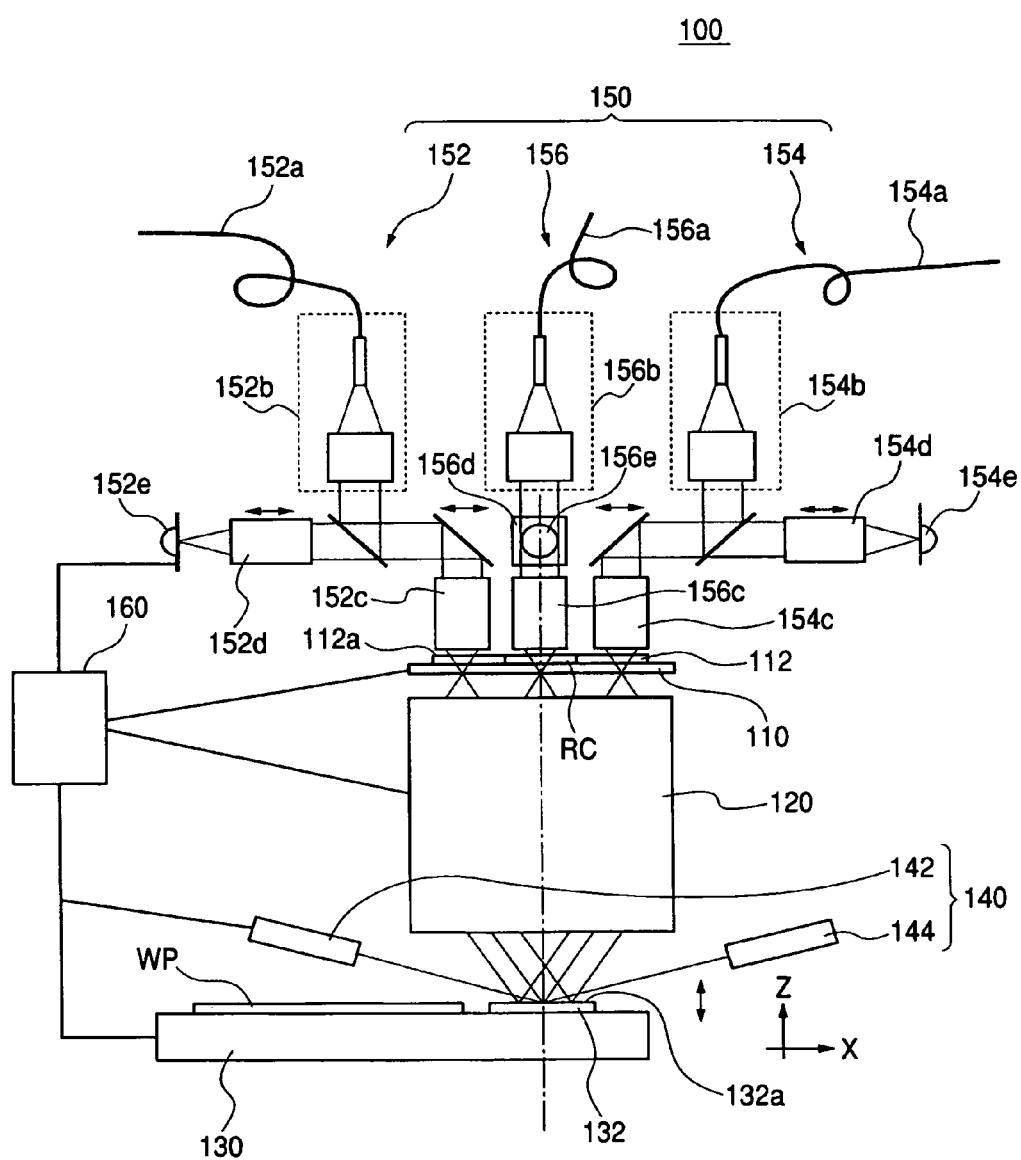
FIG. 1 is a schematic cross sectional view showing an exemplary structure of an exposure apparatus according to an aspect of the present invention.

Hereinafter, an exposure apparatus according to an aspect of the present invention will be described with reference to the accompanying drawings. Note that the same references are provided to the same members throughout the drawings and the repetitive description is omitted here. FIG. 1 is a schematic cross sectional view showing an exemplary structure of an exposure apparatus 100 according to an aspect of the present invention. Note that an illumination apparatus that illuminates a reticle RC on which a circuit pattern is formed is omitted in FIG. 1.

As shown in FIG. 1, the exposure apparatus 100 is a scanning projection exposure apparatus that exposes the circuit pattern formed on the reticle RC to a wafer WP by a step-and-scan method. The exposure apparatus 100 includes: a reticle stage 110 on which the reticle RC is mounted; a projection optical system 120; a wafer stage 130 on which the wafer WP is mounted; a focus detection system 140; a TTR alignment optical system 150; and a control unit 160. Such an exposure apparatus is suitable for a lithographic process of sub-micron, sub-quarter-micron or less.

The reticle RC is made of, for example, quartz and the circuit pattern (or image) to be transferred is formed thereon. The reticle RC is held by the reticle stage 110 and moved. The reticle RC and the wafer WP are located at positions substantially optically conjugate with each other through the projection optical system 120. A arc or slit illumination region elongated in the X-axis direction is produced on the reticle RC by the illumination apparatus which is not shown in the figure.

The reticle stage 110 holds the reticle RC and moves the reticle RC in the Y-axis direction shown in FIG. 1. A reticle side reference plate (hereinafter referred to as an "R side reference plate") 112 is fixedly disposed in a predetermined area near the reticle RC on the reticle stage 110 such that a height of the reflective surface of the R side reference plate 112 is made substantially equal to a height of the reflective surface of the reticle RC.

Figure 2:
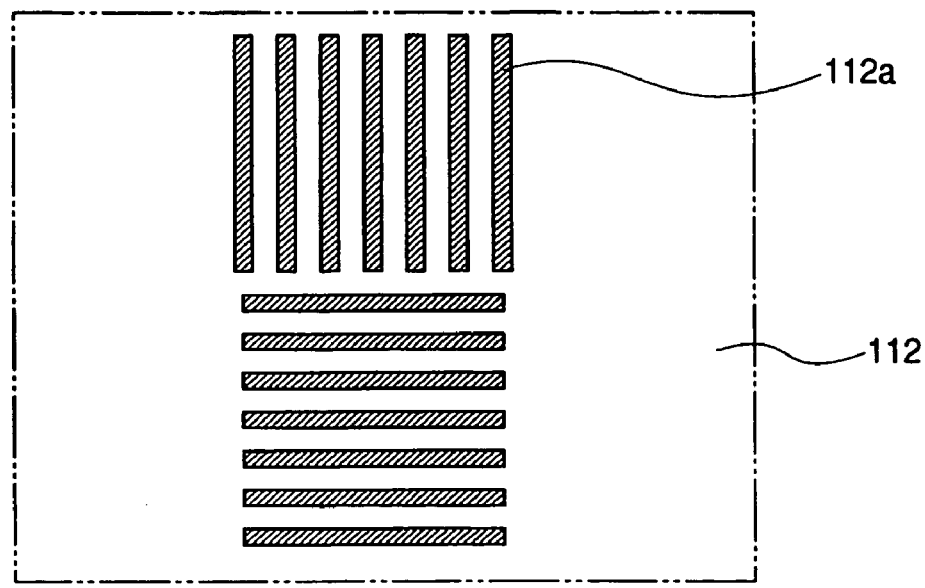
FIG. 2 is a schematic plan view showing an example of an arrangement of focal measurement marks.

A plurality of focal measurement marks 112a made of metal such as Cr or Al are formed on the reflective surface of the R side reference plate 112. As shown in FIG. 2, the focal measurement marks 112a are composed of, for example, a plurality of straight lines extended in the X- and Y-axis directions. Here, FIG. 2 is a schematic plan view showing an example of an arrangement of the focal measurement marks 112a.

An optical system that projects the circuit pattern formed on the reticle RC to the wafer WP and which is composed only of a plurality of lens elements, an optical system including a plurality of lens elements and at least one concave mirror (catadioptric optical system), an optical system including a plurality of lens elements and at least one diffraction optical element such as a kinoform, an all-mirror type optical system, or the like can be used as the projection optical system 120. When it is necessary to correct a chromatic aberration, the plurality of lens elements which have dispersion values (Abbe values) different from each other and are made of glass are used. Alternatively, the diffraction optical element and the lens elements are disposed so as to cause reverse dispersion.

The wafer WP is a semiconductor wafer in this embodiment but may broadly include a liquid crystal substrate or other such objects to be processed. A photo resist is applied to the wafer WP.

The wafer stage 130 holds the wafer WP and moves the wafer WP in the X-, Y-, and Z-axis directions shown in the figure. A wafer side reference plate (hereinafter referred to as a "W side reference plate") 132 is fixedly disposed in a predetermined area near the wafer WP on the wafer stage 130 such that a height of the reflective surface of the W side reference plate 132 is made substantially equal to a height of the top surface of the wafer WP (that is, an imaging plane of the projection optical system 120). A plurality of focal measurement marks 132a made of metal such as Cr or Al are formed on the reflective surface of the W side reference plate 132. Note that the focal measurement marks 132a are identical to the focal measurement marks 112a and thus the detailed description is omitted here.

A position of the reticle stage 110 and a position of the wafer stage 130 are monitored by, for example, a laser interferometer. The reticle stage 110 and the wafer stage 130 are driven at a speed ratio corresponding to an optical magnification of the projection optical system 120.

The focus detection system 140 is an oblique-incidence type focal position detecting unit. The focus detection system 140 includes: an irradiation section 142 that irradiates the surface of the wafer WP (or the W side reference plate 132) to which the pattern on the reticle RC is transferred, with nonexposure light in an oblique direction; and a detection section 144 that detects reflection light fluxes obliquely reflected on the surface of the wafer WP (or the W side reference plate 132).

The detection section 144 includes a plurality of light receiving elements for position detection which are provided corresponding to the respective reflection light fluxes and disposed such that the light receiving surfaces of the light receiving elements become substantially conjugate with reflection points of the respective reflection light fluxes on the wafer WP. Therefore, a displacement of position of the wafer WP (or the W side reference plate 132) in the optical axis direction of the projection optical system 120 is measured as a displacement of position on each of the light receiving elements of the detection section 144.

The TTR alignment optical system 150 includes three detection systems of a first detection system 152, a second detection system 154, and a third detection system 156, and measures an error between the measurement origin of the focus detection system 140 and the focal plane of the projection optical system. 120. In addition, the TTR alignment optical system 150 has a function of a position detecting unit that detects relative positions between the R side reference plate 112 and the W side reference plate 132. The detected relative positions are used to calculate a base line of an off-axis alignment optical system and a deviation in the scanning direction of the wafer stage 130 and the scanning direction of the reticle stage 110 (XY calibration).

The measurement of the base line is performed as follows. First, the reticle stage 110 and the wafer stage 130 are moved to a predetermined position and then relative positions between the R side reference plate 112 and the W side reference plate 132 are detected by the TTR alignment optical system 150. Next, the W side reference plate 132 is moved within a detection area of the off-axis alignment optical system by moving the wafer stage 130 and then relative positions between a reference mark provided in the off-axis alignment optical system and the focal measurement marks 132a on the W side reference plate 132 are detected. The control unit 160 described later calculates the base line of the off-axis alignment optical system based on the detection results.

As shown in FIG. 1, the first detection system 152 includes a fiber 152a, an illumination section 152b, an objective lens 152c, a relay lens 152d, and an image pickup device 152e. The second detection system 154 includes a fiber 154a, an illumination section 154b, an objective lens 154c, a relay lens 154d, and an image pickup device 154e. The third detection system 156 includes a fiber 156a, an illumination section 156b, an objective lens 156c, a relay lens 156d, and an image pickup device 156e. The first detection system 152 can magnify the pattern on the reticle RC or the R side reference plate 112 to image the magnified pattern onto the image pickup device 152e. The second detection system 154 can magnify the pattern to image the magnified pattern on the image pickup device 154e. The third detection system 156 can magnify the pattern to image the magnified pattern on the image pickup device 156e. In addition, similarly, the first detection system 152 can image the pattern on the wafer WP or the W side reference plate 132 onto the image pickup device 152e through the projection detection system 120. The second detection system 154 can image the pattern on the wafer WP or the W side reference plate 132 onto the image pickup device 154e through the projection detection system 120. The third detection system 156 can image the pattern on the wafer WP or the W side reference plate 132 onto the image pickup device 156e through the projection detection system 120.

The control unit 160 is electrically connected with the reticle stage 110, the wafer stage. 130, the focus detection system 140, and the TTR alignment optical system 150 and controls the operation of the exposure apparatus 100. The control unit 160 calculates a relative positional displacement between the reticle RC and the wafer PW using the focal measurement marks 112a and 132a detected by the TTR alignment optical system 150 and controls at least one of the position of the reticle RC and the position of the wafer WP based on the calculated positional displacement. In addition, the control unit 160 calculates a positional displacement of the wafer WP in a direction orthogonal to the optical axis of the projection optical system 120 and controls the position of the wafer WP based on the calculated positional displacement. Further, the control unit 160 calculates the tilts of the image plane of the projection optical system 120 from a detection result of the TTR alignment optical system 150 and then controls at least one of the position of the wafer WP and the image plane of the projection optical system 120 based on the calculated tilts of the image plane.

Here, a method of measuring the error between the measurement origin of the oblique-incidence type focus detection system 140 and the focal plane of the projection optical system 120 using the TTR alignment optical system 150 will be described. First, light from a light source, which is substantially identical to the exposure light is guided to the illumination sections 152b, 154b, and 156b using the fibers 152a, 154a, and 156a optical systems (not shown), and the like. The focal measurement marks 112a on the R side reference plate 112 are illuminated with the light through the objective lenses 152c, 154c, and 156c. Next, the relay lenses 152d, 154d, and 156d, the objective lenses 152c, 154c, and 156c, or the like are driven in the optical axis direction of the TTR alignment optical system 150 so as to obtain a conjugate relationship between the image pickup devices 152e, 154e, and 156e, and the R side reference plate 112.

Next, the wafer stage 130 is driven so as to obtain a state in which the focal measurement marks 132a on the W side reference plate 132 can be illuminated and detected by the TTR alignment optical system 150 through the TTR alignment optical system 150. Then, while the position of the W side reference plate 132 in the optical axis direction of the projection optical system 120 is measured by the focus detection system 140, the wafer stage 130 is driven in the optical axis direction (Z-axis direction) and a position in which a conjugate relationship is obtained between the image pickup devices 152e, 154e, and 156e, and the W side reference plate 132 is detected.

At this time, because the conjugate relationship is obtained between the image pickup devices 152e, 154e, and 156e of the TTR alignment optical system 150 and the R side reference plate 112, a conjugate relationship is obtained between the W side reference plate 132 and the R side reference plate 112. That is, the projection optical system 120 is in a focusing condition. Reading a measurement value of the focus detection system 140 in the focusing condition enables correction of the error between the measurement origin of the focus detection system 140 and the focal plane of the projection optical system 120 (focus calibration).

Figure 12:
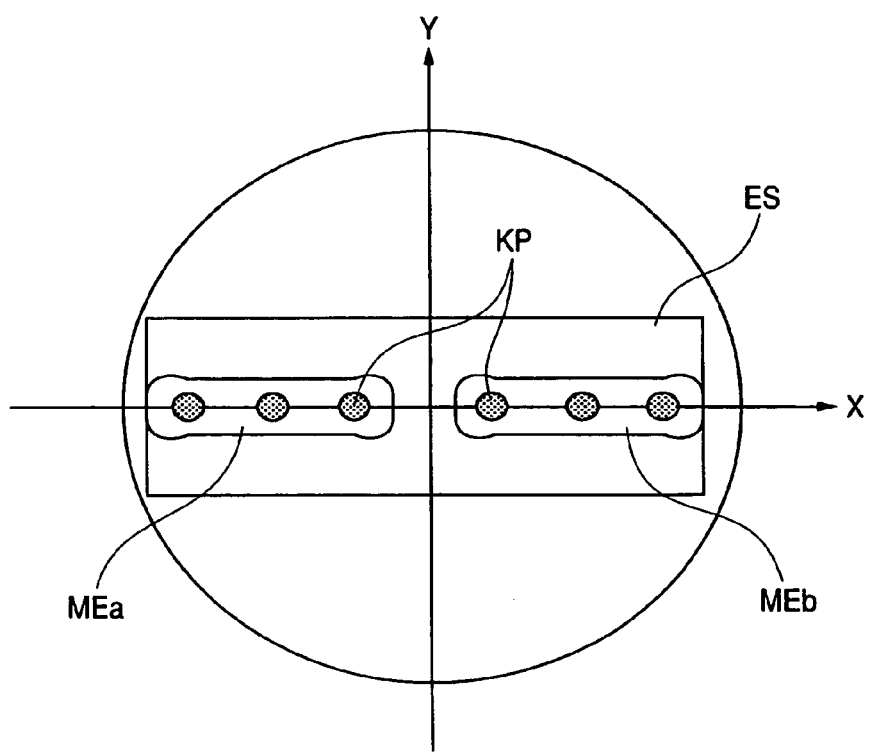
FIG. 12 is a schematic view showing drive (detection) areas of a conventional TTR alignment optical system.

As described above, in a conventional scanning projection exposure apparatus, the TTR alignment optical system is composed of two detection systems provided in the exposure slit. As shown in FIG. 12, the two detection systems are constructed such that they can be driven in the X-axis direction perpendicular to the scanning direction. The focus calibration is performed at the plurality of positions whose coordinates in the Y-axis direction are the same and only coordinates in the X-axis direction are different from each other. Therefore, the tilt of the image plane in the scanning direction cannot be measured.

Figure 3:
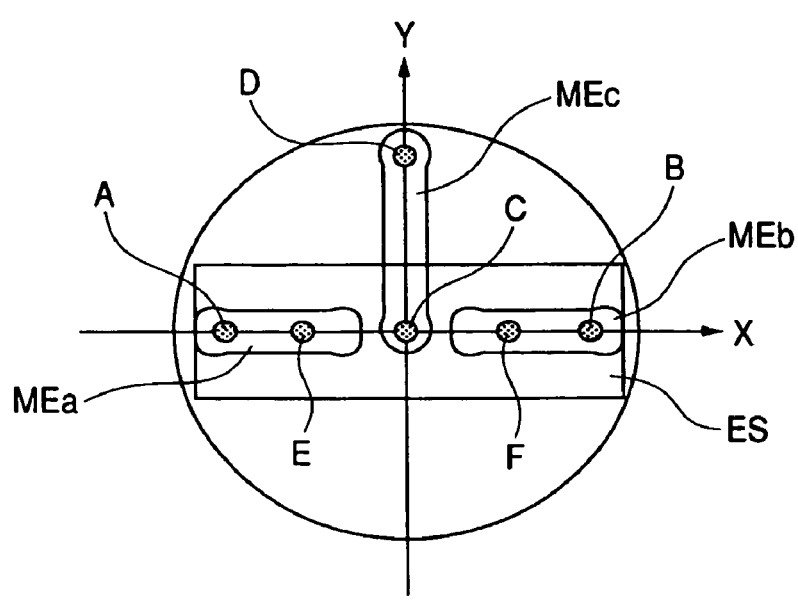
FIG. 3 is a schematic view for explaining an example of drive (detection) areas of a TTR alignment optical system shown in FIG. 1.

Thus, as shown in FIG. 1, the TTR alignment optical system 150 is composed of the three detection systems of the first detection system 152, the second detection system 154, and the third detection system 156, so that the measurements in the X-axis and Y-axis directions can be simultaneously performed at three points whose positions are different from one another. For example, as shown in FIG. 3, it is constructed such that the first detection system 152 and the second detection system 154 can be driven for detection within the areas MEa and MEb parallel to the X-axis and the third detection system 156 can be driven for detection within the area MEc parallel to the Y-axis. According to the structure, the relative positional displacement between the marks on the W side reference plate 132 or the wafer WP and the marks on the R side reference plate 112 or the reticle RC can be measured at the three measurement points A, B, and C. FIG. 3 is a schematic view for explaining an example of the drive (detection) areas of the TTR alignment optical system 150 shown in FIG. 1.

On the other hand, because the TTR alignment optical system in the conventional scanning projection exposure apparatus is composed of the two detection systems, the measurements in the X- and Y-directions can be simultaneously performed at two points whose positions are different from each other. That is, when the TTR alignment optical system 150 is composed of the three detection systems and the measurement is simultaneously performed at three points whose positions are different from one another, it is possible to obtain information 1.5 times larger than that in the conventional two-point simultaneous measurement for the same period with respect to the positional displacements between the R side reference plate 112 and the W side reference plate 132 in the X- and Y-directions.

As a result, measurement precisions in X- and Y-directions can be improved. Thus, calibration precisions in the X- and Y-directions, such as calculation of the base line of the off-axis alignment optical system and calculation of a deviation between the scanning direction of the wafer stage 130 and the scanning direction of the reticle stage 110 in the exposure apparatus 100 can be improved without reducing a throughput.

Also, as described above, the projection optical system 120 is made to the focusing condition (that is, a state in which the R side reference plate 112 and the W side reference plate 132 become conjugate with each other) using the TTR alignment optical system 150. At this time, the exposure image plane can be calculated from measurement values of the focus detection system 140 in the focusing conditions at the respective measurement points.

For example, when respective measurement points of the first detection system 152, the second detection system 154, and the third detection system 156 that compose the TTR alignment optical system 150 are set to the measurement point A, the measurement point B, and a measurement point D, the tilt of the image plane in the X-direction can be calculated from measurement values of the focus detection system 140 at the measurement point A and the measurement point B. In addition, the tilt of the image plane in the Y-direction can be calculated from an average value of the measurement values of the focus detection system 140 at the measurement point A and the measurement point B and a measurement value thereof at the measurement point D. Because the measurement values at the measurement point A, the measurement point B, and the measurement point D can be simultaneously obtained, the tilts of the image plane in the X-direction and the Y-direction can be simultaneously calculated.

Therefore, according to a conventional case, only the tilt of the image plane in one of the X-direction and the Y-direction can be calculated in the measurement of the focusing conditions of the projection optical system by the TTR alignment optical system composed of the two optical systems. However, according to this embodiment, the TTR alignment optical system 150 composed of the three detection systems (first detection system 152, second detection system 154, and third detection system 156) is used, the measurement points with respect to the respective detection systems, for example, the measurement point A, the measurement point B, and the measurement point D as shown in FIG. 2 are selected, and the focusing conditions of the projection optical system 120 can be simultaneously measured at the selected measurement points. Thus, the tilts of the image plane in the X-direction and the Y-direction can be calculated without reducing a throughput.

Based on the calculation results, the control unit 160 drives, for example, the wafer stage 130 to correct the tilts of the image plane in the scanning direction and the direction perpendicular to the scanning direction. Therefore, even in the case of an exposure apparatus using the projection optical system 120 having a high NA (i.e., small focal depth), scanning exposure can be performed with best focusing.

Also, the respective measurement points of the first detection system 152, the second detection system 154, and the third detection system 156 that compose the TTR alignment optical system 150 may be set to the measurement point A, the measurement point B, and the measurement point C and the focusing conditions of the projection optical system 120 may be simultaneously measured at the respective measurement points. When only the measurement points A and B are used, only the tilt of the image plane can be calculated. However, when the measurement point C is simultaneously used, a curvature of the image plane of the projection optical system 120 in the longitudinal direction of the exposure slit ES can be measured.

When the curvature of the image plane of the projection optical system in the longitudinal direction of the exposure slit is measured by the conventional exposure apparatus including the TTR alignment optical system composed of the two optical systems, it is necessary to drive the two detection systems on the X-axis to measure the focusing conditions of the projection optical system while changing measurement points. Therefore, there are problems in that the TTR alignment optical system (two detection systems) takes much time to drive and a measurement error resulting from a drive error is caused.

According to this embodiment, the TTR alignment optical system 150 composed of the first detection system 152, the second detection system 154, and the third detection system 156 is used, the measurement points of the respective detection systems are set to, for example, the measurement point A, the measurement point B, and the measurement point C as shown in FIG. 2, and the focusing conditions of the projection optical system 120 can be simultaneously measured. Therefore, the throughput is improved as compared with a conventional case and a factor of the measurement error resulting from the TTR alignment optical system 150 (first detection system 152, second detection system 154, and third detection system 156) is eliminated. Thus, the curvature of the image plane of the projection optical system 120 in the longitudinal direction of the exposure slit ES can be measured.

Based on the measurements, the control unit 160 drives, for example, the lenses composing the projection optical system 120 to correct the tilts of the image plane of the projection optical system 120. Therefore, even in the exposure apparatus 100 using the projection optical system 120 having a high NA, scanning exposure can be performed with best focusing.

Note that, in this embodiment, a one-dimensional CCD (line sensor) is used as the image pickup device of one detection system among the first detection system 152, the second detection system 154, and the third detection system 156 that compose the TTR alignment optical system 150, for example, the image pickup device 156e of the third detection system 156. Two-dimensional CCDs are used as the image pickup devices of the two detection systems other than the one detection system, for example, the image pickup device 152e of the first detection system 152 and the image pickup device 154e of the second detection system 154.

When the two detection systems composing the conventional TTR alignment optical system 150 are changed to the three detection systems, it is necessary to split illumination light into three. In general, the exposure apparatus illuminates the reticle with light emitted from the light source through the illumination optical system and exposes an image of the reticle to the wafer using the projection optical system. In addition, light is split in midstream of the illumination optical system by a changing mirror or the like and guided to the TTR alignment optical system. Therefore, an amount of light capable of being guided to the TTR alignment optical system varies depending on an output of the light source, a type of the illumination optical system, and a split method from the illumination optical system. Fundamentally, when the number of detection systems composing the TTR alignment optical system is increased from two to three, the light amount that can be assigned to each of the detection systems is reduced.

On the other hand, when a KrF excimer laser, an ArF excimer laser, or an F2 laser is used as the exposure light source to shorten a wavelength used, an efficiency (transmittance) of the optical system is lowered. Therefore, in order to make light incident onto the image pickup device in the same light amount as in a conventional case, it is necessary to guide intenser light to the TTR alignment optical system. Further, the photoelectric conversion efficiency of the CCD which is the image pickup device decreases with shortening the exposure light wavelength. Therefore, it is required that intenser light is made incident into the CCD itself.

Thus, in the TTR alignment optical system 150 according to this embodiment, a one-dimensional CCD (line sensor) is used as the image pickup device of a detection system, for example, the image pickup device 156e of the third detection system 156, so that the detection is possible even when the light amount is small. That is, even when a reduction in light amount per optical system resulting from an increase in the number of detection systems, insufficiency of the light amount resulting from shortening of the exposure light wavelength, or the like is caused, a reduction in detection precision resulting from the detection systems is prevented.

Figure 4:
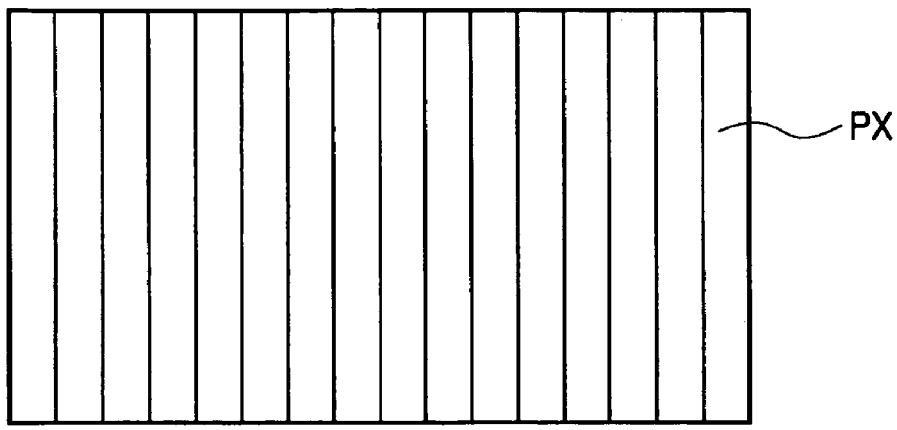
FIG. 4 is a schematic plan view showing a pixel arrangement of a one-dimensional CCD (line sensor)
Figure 5:
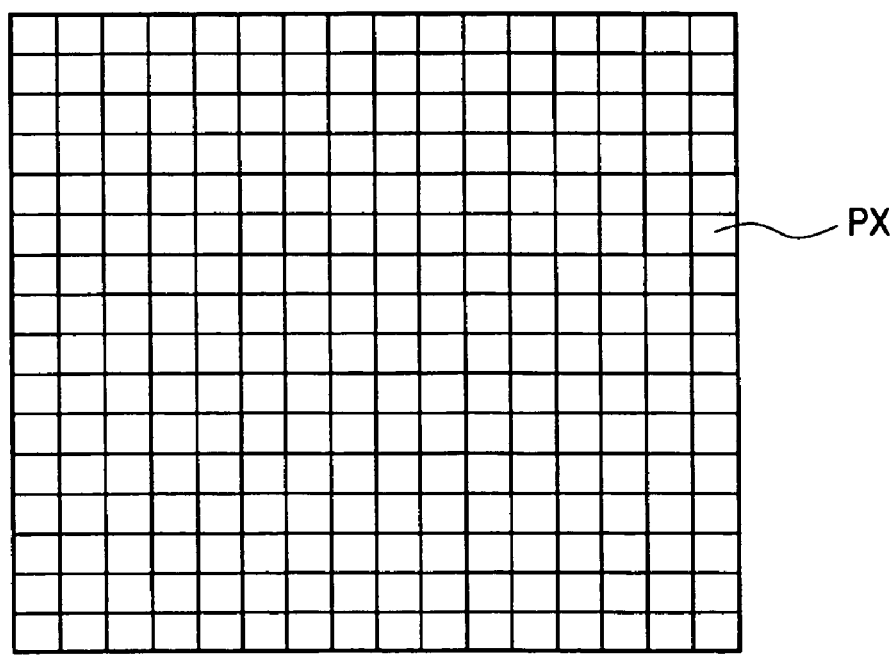
FIG. 5 is a schematic plan view showing a pixel arrangement of a two-dimensional CCD.

As shown in FIG. 4, the feature of the line sensor is that a size of each of pixels PX can be increased in a non-measurement direction (direction orthogonal to a direction in which the pixels are arranged). Therefore, when the size of each of the pixels PX in a measurement direction is equal to that in the two-dimensional CCD as shown in FIG. 5, an aperture area of the CCD (line sensor) can be increased to such an extent as to correspond to a ratio of lengths of the pixels PX of both CCDs in the non-measurement direction. FIG. 4 is a schematic plan view showing a pixel arrangement of the one-dimensional CCD (line sensor) and FIG. 5 is a schematic plan view showing a pixel arrangement of a two-dimensional CCD.

As a result, because sensitivity per pixel is proportional to the aperture area, when a line sensor having a large pixel size in the non-measurement direction is used, the photoelectric conversion efficiency per pixel can be greatly improved. As a result, lowered efficiency of the optical system resulting from shortening of the wavelength can be compensated. Further, while making use of the feature of the line sensor, the magnification of the TTR alignment optical system 150 is changed between the measurement direction and the non-measurement direction and light is condensed in the non-measurement direction. Thus, the light amount incident into each of the pixels of the line sensor can be increased.

For example, the case where a line-and-space mark having a size of 100-μm square on the wafer WP is measured using the TTR alignment optical system 150 is considered. First, when a size of a pixel of the two-dimensional CCD is set to 10-μm square and a size of a pixel of the line sensor is 10-μm (in the measurement direction)×100 μm (in the non-measurement direction), the sensitivity per pixel in the line sensor becomes about ten times higher than that in the two-dimensional CCD.

Also, when the magnification of the projection optical system 120 between the wafer WP and the reticle RC is set to 4-fold magnification and the magnification of the TTR alignment optical system 150 is set to 25-fold magnification, the magnification between the wafer WP and the two-dimensional CCD becomes 100-fold magnification. In other words, when the two-dimensional CCD is used as the image pickup device, the mark of 100-μm square on the wafer WP is enlarged to 10 mm square on the two-dimensional CCD.

On the other hand, in the case where the line sensor with 10 μm (in the measurement direction)×100 μm (in the non-measurement direction) is used as the image pickup device, when the magnification of the TTR alignment optical system 150 in the measurement direction is set to 25-fold magnification and the magnification thereof in the non-measurement direction is set to ¼-fold magnification, because the magnification of the projection optical system 120 is set to 4-fold magnification, the magnification between the wafer WP and the line sensor in the measurement direction becomes 100-fold magnification and that in the non-measurement direction becomes 1-fold magnification. In other words, the mark of 100-μm square on the wafer WP is enlarged to 10 mm in the measurement direction on the line sensor and maintained at 100 μm in the non-measurement direction.

The magnification in the measurement direction in the case where the two-dimensional CCD is used is equal to that in the case where the line sensor is used, so that the same measurement resolving power is obtained. On the other hand, because there is a difference between 100-fold magnification and one time in the non-measurement direction, a light amount per unit area on the image pickup device in the line sensor becomes 100 times larger than that in the two-dimensional CCD. When it is considered that the sensitivity per pixel is 10-fold magnification as described above, the measurement using the line sensor as the image pickup device can be performed with the light amount which is ¹⁄₁₀₀₀-fold magnification larger than that in the measurement using the two-dimensional CCD as the image pickup device. Actually, a ratio of the required light amounts between the two-dimensional CCD and the line sensor is changed according to the specification of the CCD, the shape of the alignment mark, and the, like. However, even if those points are taken into account, a ratio of light amounts of about at least ¹⁄₁₀₀ can be obtained between the line sensor and the two-dimensional CCD.

In the case where the number of detection systems composing the TTR alignment optical system 150 is changed from two to three, when the line sensor is used as the image pickup device of one of the three detection systems, for example, the image pickup device 156e of the third detection system 156, the amount of light capable of being assigned to the third detection system 156 may be 0.1% to 1% as in the conventional case using the two detection systems. Therefore, a reduction in light amount to each detection system resulting from an increase in the number of detection systems composing the TTR alignment optical system 150 from two to three can be prevented. In addition, because the light amount of about 1% can be detected by the line sensor as compared with the two-dimensional CCD, even when the efficiency of the optical system drops down to, for example, ¹⁄₁₀ owing to shortening of the exposure light wavelength, there is a light amount margin corresponding to 10 times, so that the sufficient measurement can be performed.

Also, when the line sensor is used, the measurement is performed one-dimensionally with the measurement direction set as the X-direction or the Y-direction. However, when light is split into an X-directional measurement system and a Y-directional measurement system in midstream of the TTR alignment optical system 150 using a half mirror or the like and two line sensors are used, the measurements in the X-direction and the Y-direction can be performed.

When the line sensors are used as all the image pickup devices 152e, 154e, and 156e of the three optical systems (first detection system 152, second detection system 154, and third detection system 156) that compose the TTR alignment optical system 150, the measurements can be performed in all the detection systems with the light amount of 0.1% to 1% as in the conventional case. However, because a two-dimensional image of a mark to be measured cannot be obtained, it is unsuitable for uses of mark searching and rough detection. Therefore, with respect to the image pickup devices of the three detection systems, the two-dimensional CCD is used as the image pickup device of at least one detection system and the line sensor is used as the image pickup device of at least one detection system. Thus, as described above, a reduction in light amount to each detection system resulting from an increase in the number of detection systems can be prevented. In addition to this, it is possible to perform mark searching and rough detection by the two-dimensional CCD and to perform precise measurement by the line sensor.

Also, if the illumination on the image pickup device is the same, a charge time required for photoelectric conversion in the line sensor can be reduced to ¹⁄₁₀₀ to ¹⁄₁₀₀₀ as compared with the two-dimensional CCD. In other words, when the line sensor is used for the measurement, the charge time of the CCD is shortened to shorten the measurement time, so that the throughput can be improved.

Note that, in the above-mentioned exposure apparatus 100, the focal measurement marks 132a on the W side reference plate 132 are illuminated from the TTR alignment optical system 150 through the projection optical system 120. Therefore, the reflection light from the focal measurement marks 132a passes through the projection optical system 120 twice.

Figure 6:
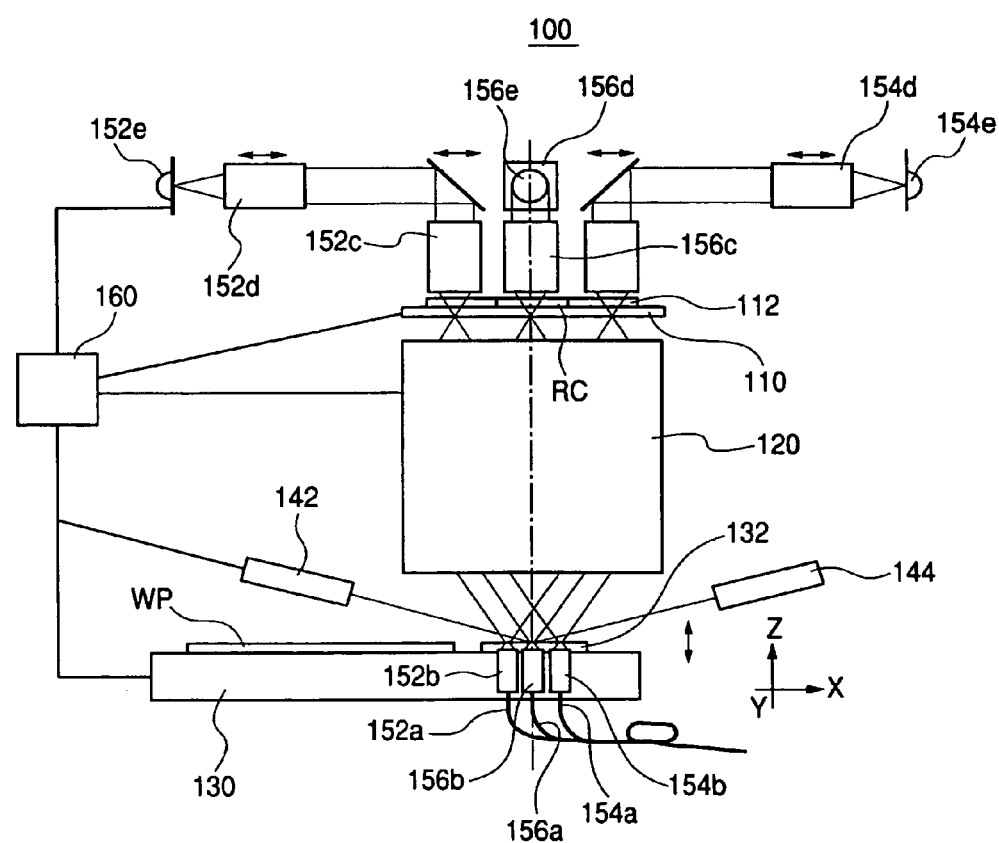
FIG. 6 is a schematic cross sectional view showing an exemplary structure of an exposure apparatus 100 according to an aspect of the present invention.

Here, as shown in FIG. 6, a TTR alignment optical system 150 is constructed so as to illuminate the focal measurement marks 132a on the W side reference plate 132 from the rear side of the W side reference plate 132. When the focal measurement marks 132a are directly illuminated from the rear side of the W side reference plate 132, the reflection light from the focal measurement marks 132a passes through the projection optical system 120 only once. Thus, in particular, in an exposure apparatus or the like using as a light source an F2 laser in which the transmittance of the projection optical system is low, the focal measurement can be performed by passing light through the projection optical system only once, which is very advantageous in terms of the light amount. FIG. 6 is a schematic cross sectional view showing an exemplary structure of the exposure apparatus 100 according to an aspect of the present invention.

Note that, the case of the TTR alignment optical system 150 includes the first detection system 152, the second detection system 154, and the third detection system 156. The first detection system 152 includes the objective lens 152c, the relay lens 152d, the image pickup device 152e, and the like. The second detection system 154 includes the objective lens 154c, the relay lens 154d, and the image pickup device 154e, and the like. The third detection system 156 includes the objective lens 156c, the relay lens 156d, and the image pickup device 156e, and the like. A structure in which another optical system is further added may be used.

Also, when the focusing conditions of the projection optical system 120 are measured, in addition to driving the wafer stage 130 in the Z-direction, a part of the TTR alignment optical system 150, such as the objective lenses 152c, 154c, and 156c or the relay lenses 152d, 154d, and 156d, or the entire TTR alignment optical system 150 can be driven in the optical axis direction to perform the measurement.

The drive areas of the TTR alignment optical system 150 are not limited to the areas shown in FIG. 3, and therefore arbitrary drive areas for obtaining the same function can be set. In addition, the focal measurement marks 112a on the R side reference plate 112 and the focal measurement marks 132a on the W side reference plate 132 are not limited to the marks shown in FIG. 2, and therefore another mark structure having the same function may be used. In addition, the TTR alignment optical system 150 may be composed of three or more detection systems.

In the exposure, the reticle RC is illuminated with light emitted from an illumination apparatus which is not shown in the drawing by Koehler illumination. Light for a reticle pattern by passing through the reticle RC is imaged onto the wafer WP by the projection optical system 120. The exposure apparatus 100 can realize high-precision focus calibration using the TTR alignment optical system 150 without reducing the throughput. Therefore, a device (such as semiconductor device, an LCD device, an image pickup device (such as CCD), or a thin film magnetic head) which is economically efficient and has a higher grade than conventional ones can be provided.

Here, the focal measurement marks on the reticle side may be provided on the reticle, on the R-side reference plate which is provided on the reticle stage, or on both in a mixed state (for example, a mark is provided on the reticle and two marks are provided on the R-side reference plate). Of course, similarly, the focal measurement marks on the wafer side may be provided on the wafer, on the W-side reference plate which is provided on the wafer stage, or on both in a mixed state.

Also, in the case where the exposure is performed by the exposure apparatus according to this embodiment, when at least one reticle side focal measurement mark is provided outside the reticle irradiation region (exposure slit) for reticle irradiation, a distance between the marks can be sufficiently lengthened. Thus, the detection precision can be desirably increased. In addition, similarly, at least one wafer side focal measurement mark may be provided outside the wafer irradiation region (exposure slit).

Figure 7:
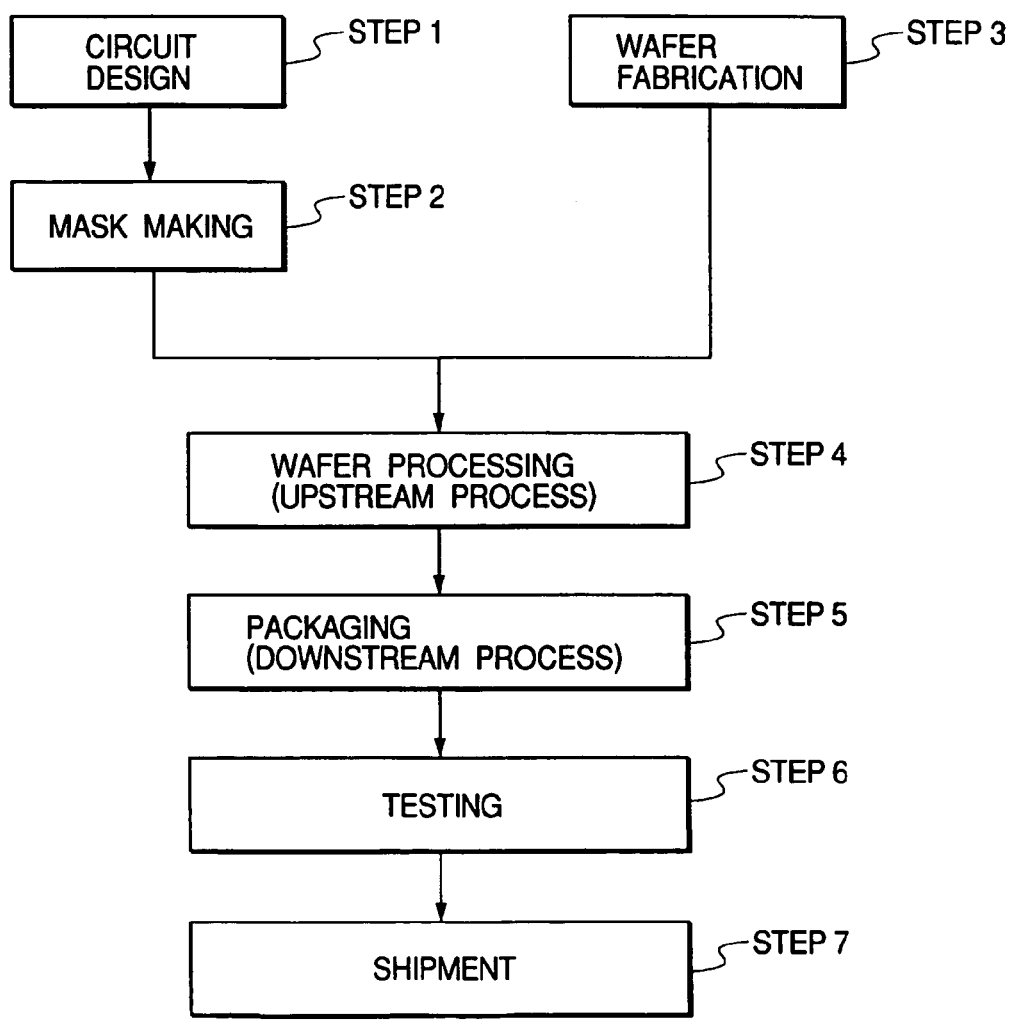
FIG. 7 is a flowchart for explaining a manufacturing flow of a device (such as a semiconductor chip such as an IC or an LSI, an LCD, or a CCD)

Next, an embodiment of a device manufacturing method using the above-mentioned exposure apparatus 100 will be described with reference to FIGS. 7 and 8. FIG. 7 is a flowchart for explaining a manufacturing flow of a device (such as a semiconductor chip such as an IC or an LSI, an LCD, or a CCD). Here, an example in which the semiconductor chip is manufactured will be described. In Step 1 (circuit design), a circuit design of the device is performed. In Step 2 (mask making), a mask on which the designed circuit pattern is formed is made. In Step 3 (wafer fabrication), a wafer is fabricated using a material such as silicon. Step 4 (wafer processing) is called an upstream process. In Step 4, an actual circuit is formed on the wafer using the mask and the wafer by a lithographic technique. Step 5 (packaging) is called a downstream process which is a process of producing a semiconductor chip using the wafer obtained in Step 4. Step 5 includes processes such as assembly process (dicing and bonding) and a packaging process (chip sealing). In Step 6 (testing), a test such as an operation check or a durability test is performed on a semiconductor device produced in Step 5. The semiconductor device is completed through the processes, followed by shipment thereof (Step 7).

Figure 8:
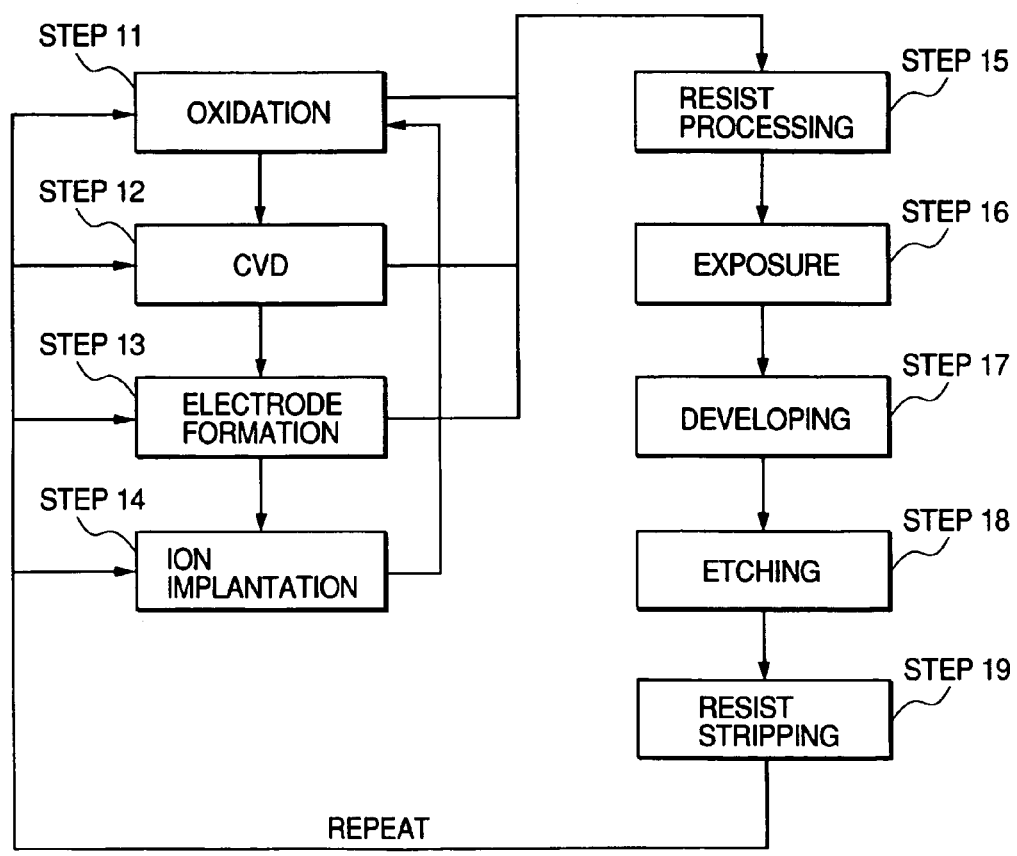
FIG. 8 is a flowchart for explaining the wafer processing in Step 4 shown in FIG. 7 in detail.
Figure 9:
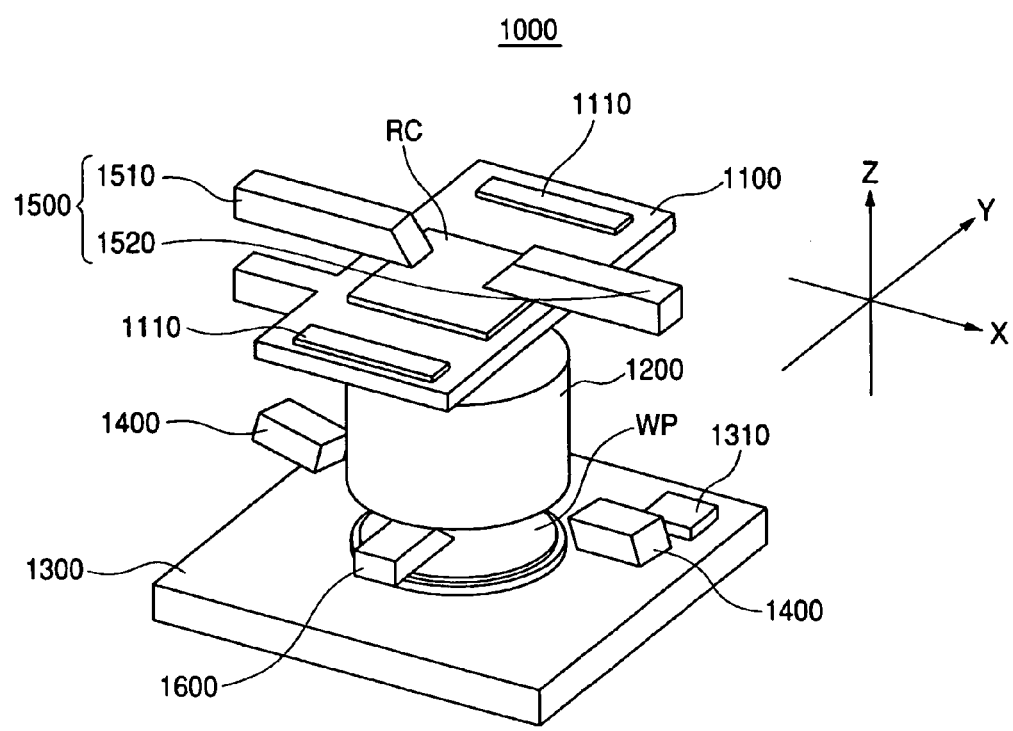
FIG. 9 is a schematic perspective view showing an exemplary structure of a conventional scanning projection exposure apparatus.
Figure 10:
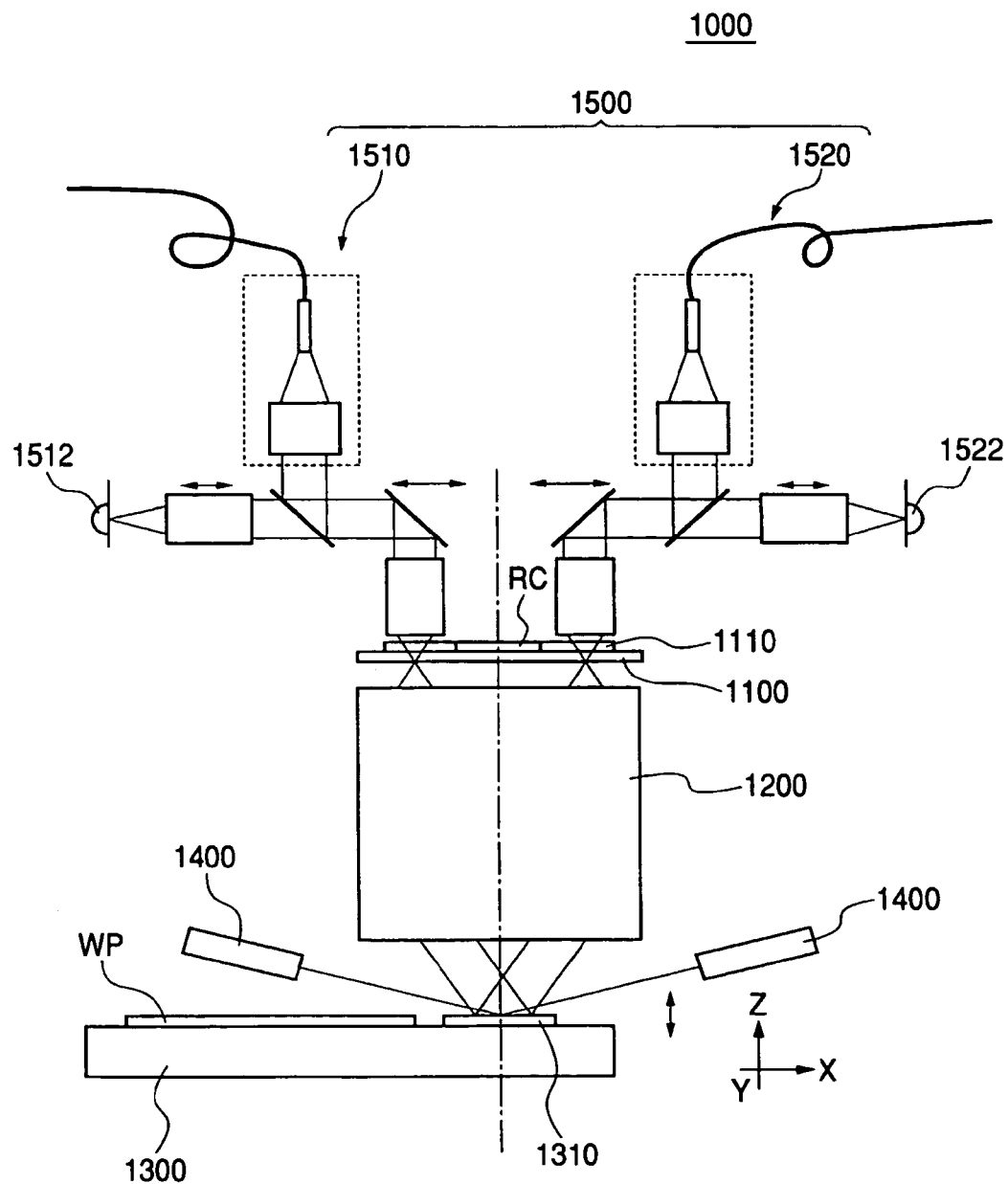
FIG. 10 is a schematic cross sectional view showing an exemplary structure of the conventional scanning projection exposure apparatus.
Figure 11:
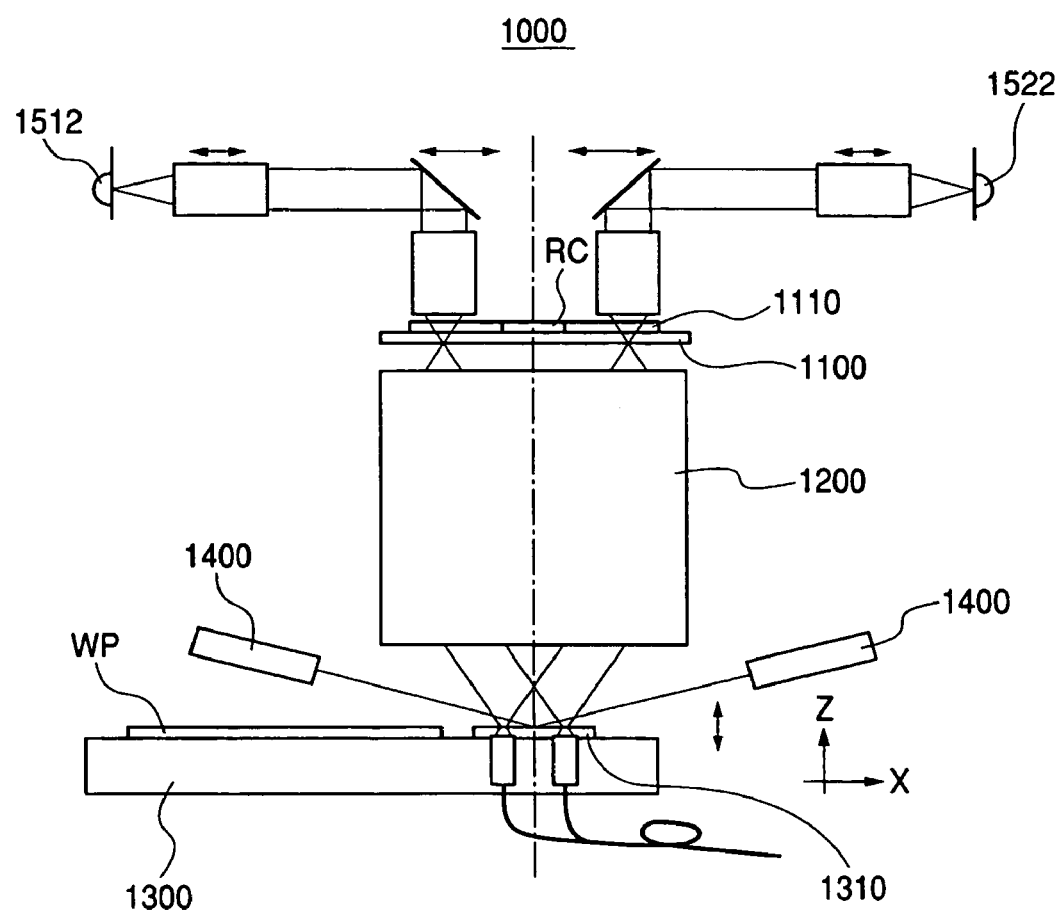
FIG. 11 is a schematic cross sectional view showing an exemplary structure of a conventional scanning projection exposure apparatus.

FIG. 8 is a flowchart for explaining the wafer processing in Step 4 in detail. In Step 11 (oxidation), the surface of the wafer is oxidized. In Step 12 (CVD), an insulating film is formed on the surface of the wafer. In Step 13 (electrode formation), an electrode is formed on the wafer by evaporation or the like. In Step 14 (ion implantation), ions are implanted into the water. In Step 15 (resist processing), a photosensitive agent is applied onto the wafer. In Step 16 (exposure), the circuit pattern of the mask is exposed to the wafer by the exposure apparatus 100. In Step 17 (developing), the exposed wafer is developed. In Step 18 (etching), a region other than a developed resist image is removed. In Step 19 (resist stripping), an unnecessary resist left after etching is removed. These steps are repeated, so that a multiple circuit pattern is formed on the wafer. According to the device manufacturing method in this embodiment, a high-grade device can be manufactured as compared with a conventional device. Thus, the device manufacturing method using the exposure apparatus 100 and the resultant device provide an aspect of the present invention.

The preferred embodiments of the present invention have been described so far. It is needless to say that the present invention is not limited to the embodiments. Therefore, various modifications and changes can be made without departing from the spirit of the present invention.

What is claimed is:

1. An exposure apparatus, comprising:
   a first stage on which a reticle is mounted;
   a second stage on which a substrate is mounted; an illumination optical system for illuminating the reticle with light from a light source;
   a projection optical system that projects a pattern formed on the reticle to the substrate; and
   at least three detection systems that can simultaneously detect at least three marks formed on at least one of the substrate and the second stage at different positions through the projection optical system by using the light from the light source.

2. An exposure apparatus according to claim 1, wherein at least one of the at least three marks is located on an optical axis of the projection optical system.

3. An exposure apparatus according to claim 1, wherein at least one of the at least three marks is located outside an irradiation area of the substrate irradiated with exposure light.

4. An exposure apparatus according to claim 1, wherein the pattern formed on the reticle is exposed to the substrate by scanning the reticle and the substrate in synchronous with each other using the first stage and the second stage, and wherein when a position of an optical axis of the projection optical system is set to an origin, a Y-axis is set in a scanning direction, and an X-axis is set in a direction orthogonal to the scanning direction, at least two of the at least three marks are located symmetrically about the Y-axis and at least one other than the at least two marks is located on the Y-axis at a position other than the origin.

5. An exposure apparatus according to claim 4, wherein a Y-coordinate of the at least one mark located on the Y-axis at the position other than the origin is different from Y-coordinates of the at least two marks located symmetrical about the Y-axis.

6. An exposure apparatus according to claim 1, wherein each of the at least three detection systems includes an image pickup device that receives an image of the corresponding mark, and wherein at least one of the image pickup devices included in the at least three detection systems is a line sensor in which a plurality of pixels are arranged in only a direction.

7. An exposure apparatus according to claim 6, wherein a magnification of the image of the corresponding mark received by the line sensor in the direction in which the pixels are arranged differs from a magnification thereof in a direction orthogonal to the direction in which the pixels are arranged.

8. A device manufacturing method, comprising the steps of:

applying a photosensitive agent to a substrate;
exposing the substrate by the exposure apparatus according to claim 1; and
developing the exposed substrate.

* * * * *